US007880312B2

(12) United States Patent
Okumura (10) Patent No.: US 7,880,312 B2
(45) Date of Patent: Feb. 1, 2011

(54) SEMICONDUCTOR MEMORY DEVICE (75) Inventor: Naohisa Okumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/489,658

(22) Filed: Jun. 23, 2009

(65) Prior Publication Data
US 2009/0321960 A1 Dec. 31, 2009

(30) Foreign Application Priority Data
Jun. 27, 2008 (JP) .......................... P2008-168132

(51) Int. Cl.
*H01L 23/48* (2006.01)
*H01L 23/52* (2006.01)
*H01L 29/40* (2006.01)
(52) U.S. Cl. ................ 257/777; 257/784; 257/E23.141
(58) Field of Classification Search ................ 257/777, 257/784, E23.141
See application file for complete search history.

(56) References Cited
U.S. PATENT DOCUMENTS
5,812,814 A    9/1998  Sukegawa

| 6,650,009 | B2 | 11/2003 | Her et al. |
| 6,979,905 | B2 | 12/2005 | Nishida et al. |
| 7,009,303 | B2 | 3/2006 | Kuroda et al. |
| 7,327,038 | B2 | 2/2008 | Kwon et al. |
| 2006/0157866 | A1 | 7/2006 | Le et al. |
| 2006/0175715 | A1 | 8/2006 | Hirose et al. |
| 2007/0170573 | A1 | 7/2007 | Kuroda et al. |
| 2007/0218588 | A1 | 9/2007 | Takiar et al. |
| 2009/0200680 | A1* | 8/2009 | Shinohara et al. ........... 257/773 |

FOREIGN PATENT DOCUMENTS
EP    0 613 151 A2    8/1994
JP    7-78056    3/1995

* cited by examiner

*Primary Examiner*—Thien F Tran
(74) *Attorney, Agent, or Firm*—Oblon, Spivak, McClelland, Maier & Neustadt, L.L.P.

(57) ABSTRACT

A plurality of semiconductor memory chips are stacked on a first main surface of a wiring board, and an interposer chip is stacked on the plurality of semiconductor chips, and a semiconductor controller chip is stacked on the interposer chip. The plurality of semiconductor memory chips are independently and electrically connected with inner connecting terminals formed on the wiring board, respectively, and independently controlled by the semiconductor controller chip which is electrically connected with another inner connecting terminals formed on the wiring board via the interposer chip.

6 Claims, 5 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2008-168132 filed on Jun. 27, 2008; the entire contents which are incorporated herein by reference.

BACKGROUND OF THE INVENTION

1. Field of the Invention

This invention relates to a semiconductor memory device.

2. Description of the Related Art

Most of information processing devices such as conventional workstations and personal computers employ magnetic disk devices as memory devices, respectively. The magnetic disk device has some advantages of high recording reliability and low bit cost, but some disadvantages of large device size and low physical impact resistance.

The magnetic disk device employs the operation principle of conducting magnetic recording of data and magnetic reading out of data for a magnetic recording medium. The movable portions such as the magnetic recording medium and the magnetic head of the magnetic disk device may cause malfunction and failure for the magnetic disk device when physical impact is applied to the magnetic disk device. Moreover, the movable portions of the magnetic disk device pose an impediment for downsizing of the magnetic disk device.

In this point of view, the magnetic disk device does not work against a desktop computer which is to be used under the condition of fixing to a desk, but works against a small and portable laptop computer and notebook computer.

Recently, in this point of view, attention is paid to a small semiconductor memory device with large physical impact resistance. In these latter days when a large capacity memory such as a NAND flash memory is developed, the semiconductor memory device raises expectations for the substitution of the magnetic disk device more than ever.

The semiconductor device is configured such that a plurality of semiconductor memory chips are arranged in parallel on a surface of a wiring board and controller chips for corresponding to the semiconductor memory chips are also arranged in parallel on the same surface of the wiring board. Moreover, some high-speed cache memories as buffer memories for storing data temporally are arranged on the same surface of the wiring board as occasion demands, in addition to the semiconductor chips (Reference 1)

[Reference 1] JP-A 07-078056 (KOKAI)

BRIEF SUMMARY OF THE INVENTION

An aspect of the present invention relates to a semiconductor memory device, including: a wiring board having a first main surface on which first inner connecting terminals, second inner connecting terminals and third inner connecting terminals are formed and having a second main surface on which external connecting terminals are formed; a plurality of semiconductor memory chips which are stacked on the first main surface of the wiring board, each semiconductor memory chip having first electrode pads arranged along at least one outer edge portion thereof so that the first electrode pads are electrically connected with the first inner connecting terminals via first wires, respectively; an interposer chip which is formed on the plurality of semiconductor memory chips and which has second electrode pads arranged along at least one outer edge portion thereof on a top surface thereof and third electrode pads arranged in an inner side thereof on the top surface thereof so that the second electrode pads are electrically connected with the second inner connecting terminals via second wires, respectively; a semiconductor controller chip which is formed on the interposer chip and which has fourth electrode pads arranged along at least one edge portion thereof on a top surface thereof so that the fourth electrode pads are electrically connected with the third electrode pads via third wires, respectively; and a semiconductor cache memory chip which is formed on the first main surface of the wiring board and which has fifth electrode pads on a top surface thereof so that the fifth electrode pads are electrically connected with the third inner connecting terminals via fourth wires, respectively.

Another aspect of the present invention relates to a semiconductor memory device, including: a wiring board having a first main surface on which first inner connecting terminals and second inner connecting terminals are formed and having a second main surface on which external connecting terminals are formed; a plurality of semiconductor memory chips which are stacked on the first main surface of the wiring board, each semiconductor memory chip having first electrode pads arranged along at least one outer edge portion thereof on a top surface thereof so that the first electrode pads are electrically connected with the first inner connecting terminals via first wires, respectively; an interposer chip which is formed on the plurality of semiconductor memory chips and which has second electrode pads arranged along at least one outer edge portion thereof on a top surface thereof and third electrode pads, fourth electrode pads arranged in an inner side thereof on the top surface thereof so that the second electrode pads are electrically connected with the second inner connecting terminals via second wires, respectively; a semiconductor controller chip which is formed on the interposer chip and which has fifth electrode pads arranged along at least one outer edge portion thereof on a top surface thereof so that the fifth electrode pads are electrically connected with the third electrode pads via third wires, respectively.

Still another aspect of the present invention relates to a semiconductor memory device, including: a wiring board having a first main surface on which first inner connecting terminals, second inner connecting terminals and third inner connecting terminals are formed and having a second main surface on which external connecting terminals are formed; a plurality of semiconductor memory chips which are stacked on the first main surface of the wiring board, each semiconductor memory chip having first electrode pads arranged along at least one outer edge portion thereof so that the first electrode pads are electrically connected with the first inner connecting terminals via first wires, respectively, one of the plurality of semiconductor memory chips located at a top thereof having a rewiring layer thereon, second electrode pads along at least one outer edge portion thereof and third electrode pads arranged in an inner side thereof so that the second electrode pads are electrically connected with the second inner connecting terminals via second wires, respectively, thereby functioning as an interposer chip; and a semiconductor controller chip which is formed on the plurality of semiconductor chips and which has fourth electrode pads arranged along at least one outer edge portion thereof on a top surface thereof so that the fourth electrode pads are electrically connected with the third electrode pads via third wires, respectively; and a semiconductor cache memory chip which is formed on the first main surface of the wiring board and which has fifth electrode pads on a top surface thereof so that the fifth electrode pads are electrically connected with the third inner connecting terminals via fourth wires, respectively.

DETAILED DESCRIPTION OF THE INVENTION

Then, some concrete embodiments will be described with reference to the drawings.

First Embodiment

Figure 1:
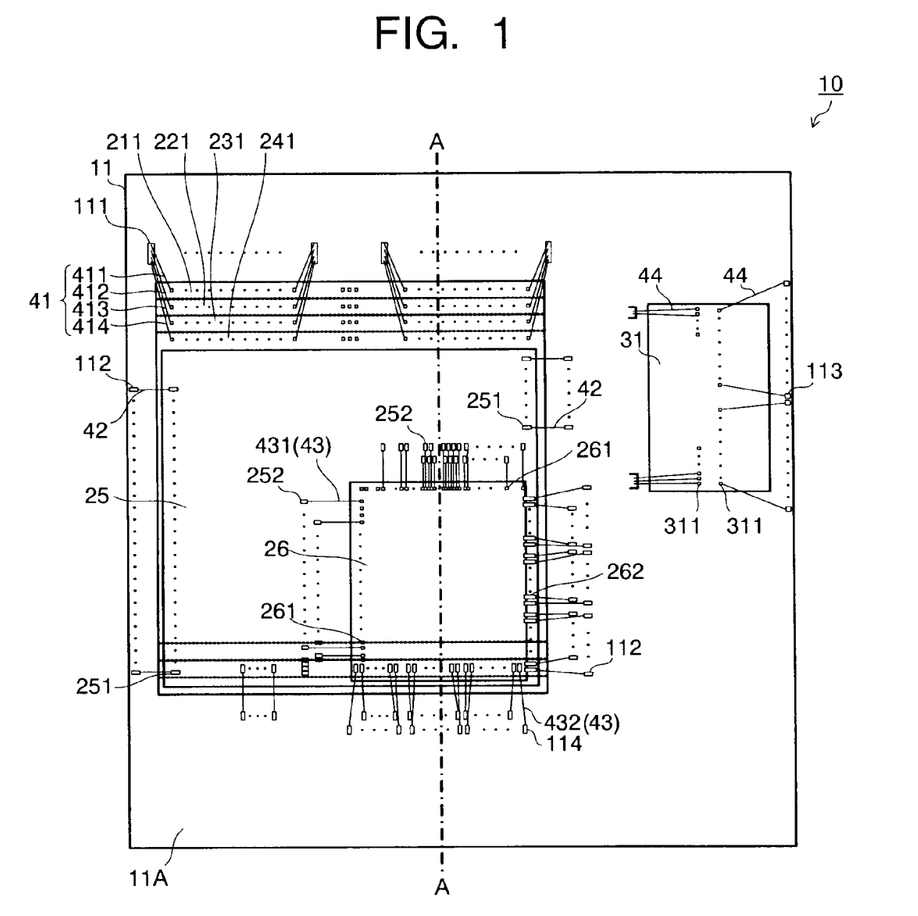
FIG. 1 is a plan view of a semiconductor memory device according to a first embodiment.
Figure 2:
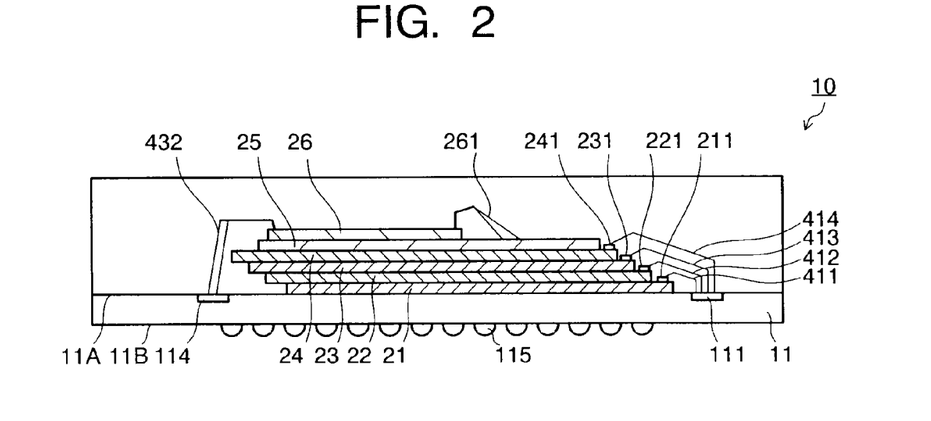
FIG. 2 is a cross sectional view of the semiconductor memory device shown in FIG. 1, taken on line A-A.

FIG. 1 is a plan view of a semiconductor memory device according to a first embodiment, and FIG. 2 is a cross sectional view of the semiconductor memory device shown in FIG. 1, taken on line A-A.

As shown in FIGS. 1 and 2, a semiconductor memory device 10 includes a wiring board 11. The wiring board 11 is made of glass-epoxy resin, BT resin (bismaleimide triazine resin) or the like, and has wiring layers (not shown) therein. On a first main surface 11A of the wiring board 11 are formed first inner connecting terminals 111, second connecting terminals 112 and third inner connecting terminals 113, and on a second main surface 11B of the wiring board 11 are formed external connecting terminals 115 of BGA type. In this embodiment, fourth inner connecting terminals 114 are additionally provided in addition to the first inner connecting terminals 111, the second connecting terminals 112 and the third connecting terminals 113.

The first inner connecting terminals 111, the second inner connecting terminals 112, the third inner connecting terminals 113 and the fourth inner connecting terminals 114 are electrically connected with the external connecting terminals 115 via the wiring layers so that operating voltage and the like from an external circuit is supplied to the external connecting terminals 115 and thus, to the first inner connecting terminals 111, the second inner connecting terminals 112, the third inner connecting terminals 113 and the fourth inner connecting terminals 114 via the wiring layer. In this way, semiconductor memory chips mounted on the wiring board 11 can be operated as will described below.

The data and the like stored in the semiconductor memory chips are supplied to the first inner connecting terminals 111, the second inner connecting terminals 112, the third inner connecting terminals 113 and the fourth inner connecting terminals 114, and then, to the external connecting terminals 115 via the wiring layers. As a result, the data is supplied to the external connecting terminals 115 via the wiring layers and thereafter, an external circuit or the like via, and processed.

Moreover, the first inner connecting terminals 111, the second inner connecting terminals 112, the third inner connecting terminals 113 and the fourth inner connecting terminals 114 are electrically connected with one another via the wiring layers so as to be controlled on a control signal supplied from a semiconductor controller chip as will described below.

On the first main surface 11A of the wiring board 11 are subsequently stacked a first semiconductor memory chip 21, a second semiconductor memory chip 22, a third semiconductor memory chip 23 and a fourth semiconductor memory chip 24 so that the edge portions of semiconductor chips located below can be exposed in the same side of the stacking structure made of the chips 21 to 24. In FIG. 1, the top edge portions of the semiconductor chips 21 to 24 are exposed in the same side of the stacking structure. On the fourth semiconductor memory chip 24 is stacked an interposer chip 25 so that the edge portions of semiconductor chips 21 to 24 located below can be exposed in the same side of the stacking structure as described above. In FIG. 1, the top edge portions of the semiconductor chips 21 to 24 are exposed in the same side of the stacking structure.

The semiconductor memory chips 21 to 24 function as main memories of the semiconductor memory device 10 in this embodiment, and may be made of large capacity semiconductor memory chips such as NAND flash memories or NOR flash memories, respectively.

On the interposer chip 25 is stacked a semiconductor controller chip 26 along the lower right edge portion of the interposer chip 25. Moreover, on the first main surface 11A of the wiring board 11 is mounted a semiconductor cache memory chip 31 in the vicinity of the semiconductor memory chips 21 to 24 which are stacked. The semiconductor cache memory chip 31 temporally stores data to be stored in the semiconductor memory device 10 and thus, made of a smaller capacity semiconductor memory chip such as DRAM or SDRAM.

As shown in FIGS. 1 and 2, electrode pads 211, 221, 231, 241 are formed on the exposed top surfaces of the same edge portions of the semiconductor memory chips 21, 22, 23, 24, respectively. The electrode pads 211, 221, 231, 241 constitute first electrode pads.

On the top surface of the interposer chip 25 are formed second electrode pads 251 along the outer edge portion of the interposer chip 25 and third electrode pads 252 in the inner side of the interposer chip 25 so as to be along the outer edge portion of the semiconductor controller chip 26. The second electrode pads 251 and the third electrode pads 252 are electrically connected with one another via the wiring layers (not shown) formed in the interposer chip 25.

On the top surface of the semiconductor controller chip 26 are formed electrode pads 261 along the top edge portion and the left edge portion of the semiconductor controller chip 26 and electrode pads 262 along the right edge portion and the bottom edge portion of the semiconductor controller chip 26. The electrode pads 261 and 262 constitute fourth electrode pads.

On the top surface of the semiconductor cache memory 31 are formed fifth electrode pads 311.

Not particularly depicted, insulating layers made of polyimide or the like are formed on the top surfaces of the semiconductor memory chips 21 to 24, the top surface of the semiconductor interposer chip 25 and the top surface of the semiconductor cache memory 31, respectively. In this case, the electrode pads as described above are exposed from the insulating layers.

The first electrode pads 211 to 241 of the semiconductor memory chips 21 to 24 are independently and electrically connected with the first inner connecting terminals 111 on the first main surface 11A of the wiring board 11 via corresponding wires 411, 412, 413, 414. The wires 411, 412, 413, 414 constitute first wires 41. The second electrode pads 251 of the interposer chip 25 are electrically connected with the second inner connecting terminals 112 formed on the first main surface 11A of the wiring board 11 via second wires 42

The electrode pads 261 of the semiconductor controller chip 26 are electrically connected with the third electrode pads 252 of the interposer chip 25 via wires 431. The electrode pads 262 of the semiconductor controller chip 26 are electrically connected with the fourth inner connecting terminals 114 formed on the first main surface 11A of the wiring board 11 via wires 432. The wires 431 and 432 constitute third wires 43.

The electrode pads 311 of the semiconductor cache memory 31 are electrically connected with the third inner connecting terminals 113 formed on the first main surface 11A of the wiring board 11 via fourth wires 44.

In the semiconductor memory device 10 of this embodiment, the semiconductor memory chips 21 to 24 are stacked and arranged, and the semiconductor controller chip 26 for the semiconductor chips 21 to 24 is disposed above the semiconductor chips 21 to 24 via the interposer chip 25. Therefore, since the package area can be narrowed in comparison with the case where a plurality of semiconductor chips and a semiconductor controller are arranged in parallel on a wiring board and the case where a plurality of semiconductor chips and a semiconductor controller are independently packaged, the semiconductor memory device can be downsized.

In this case, as shown in FIG. 1, since the inner portions of the semiconductor controller chip 26 is electrically connected with the wiring board 11 via the interposer chip 25 (the electrode pads 261 are electrically connected with the electrode pads 252 via the third wires 431), the length of the wires for electric connection can be shortened in comparison with the case where the semiconductor controller chip 26 is directly and electrically connected with the wiring board 11. Therefore, the electric short in the wires, originated from that the wires are elongated and contacted with one another, can be prevented, and the electric short in the semiconductor chips, originated from that the wires are electrically connected with the semiconductor memory chips, can be prevented. As a result, the malfunction of the semiconductor memory device 10 can be prevented.

In the semiconductor memory device 10 of this embodiment, the semiconductor memory chips 21 to 24 are electrically connected with the first inner connecting terminals 111 of the wiring boards 11 via the wires 411 to 414, respectively. Moreover, the semiconductor controller chip 26 is electrically connected with the electrode pads 252 of the interposer chip 25 via the wires 431, and the electrode pads 251 of the interposer chip 25 are electrically connected with the second inner connecting terminals 112 formed on the first main surface 11A of the wiring board 11. In addition, the electrode pads 262 of the semiconductor controller chip 26 are electrically connected with the fourth inner connecting terminals 114 formed on the first main surface 11A of the wiring board 11 via the wires 432.

Therefore, predetermined control signals can be independently supplied to the semiconductor memory chips 21 to 24 from the semiconductor controller chip 26 so that the semiconductor memory chips 21 to 24 can be independently controlled. In this point of view, the operating speed of each of the semiconductor memory chips 21 to 24, that is, the semiconductor memory device 10 can be developed.

Since the heats generated at the semiconductor memory chips 21 to 24 can be radiated for the wiring board 11 via the first wires 41 (wires 411, 412, 413, 414), the heat generation at each of the semiconductor memory chips 21 to 24 can be suppressed. Since the heat generated at the semiconductor controller chip 26 is shadowed by the interposer chip 25, the semiconductor memory chips 21 to 24 can not be affected by the heat generation at the semiconductor controller chip 26. As a result, the malfunction of the semiconductor memory device 10 due to the heat generation at the semiconductor memory chips 21 to 24, that is, itself can be prevented.

The interposer chip 25 may be made of semiconductor base material such as Si or resin base material such as glass epoxy resin, polyimide resin.

Second Embodiment

Figure 3:
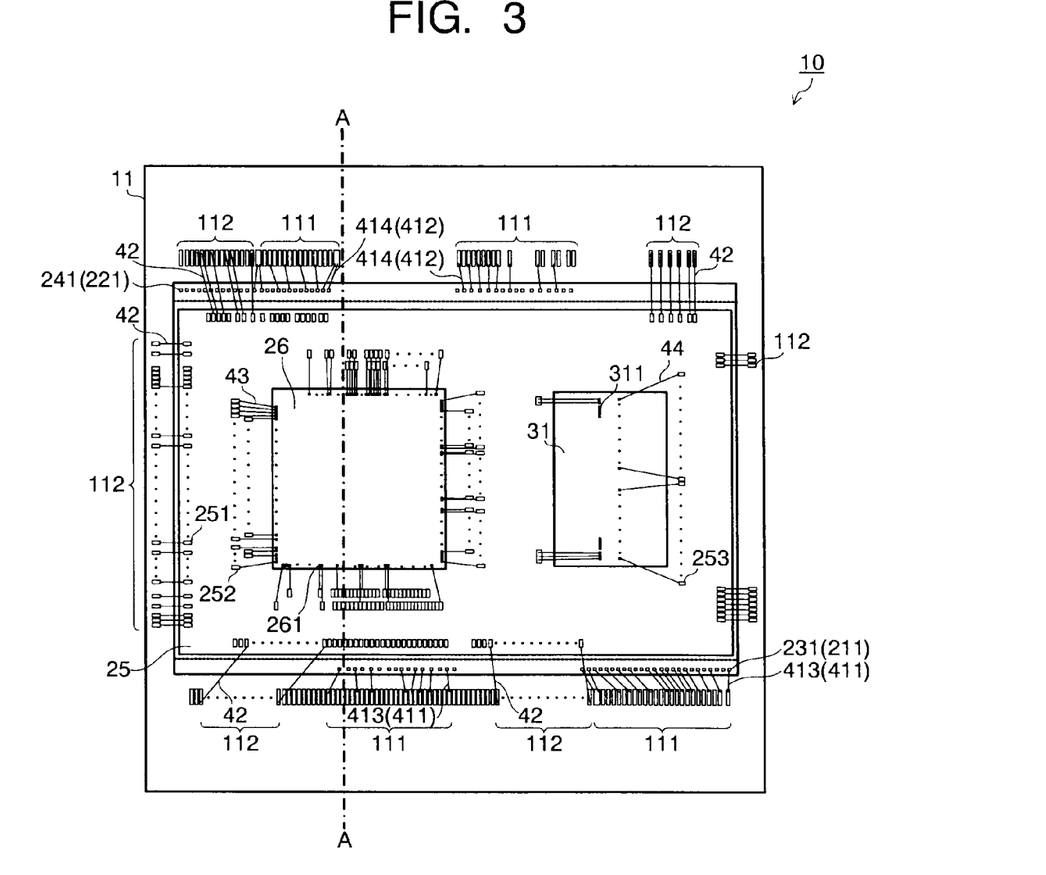
FIG. 3 is a plan view of a semiconductor memory device according to a second embodiment.
Figure 4:
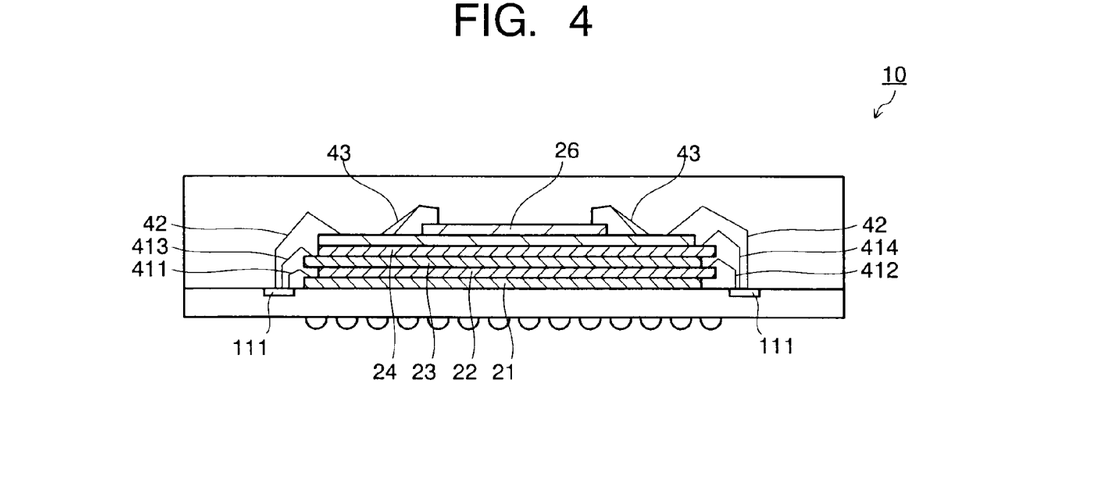
FIG. 4 is a cross sectional view of the semiconductor memory device shown in FIG. 3, taken on line A-A.

FIG. 3 is a plan view of a semiconductor memory device according to a second embodiment, and FIG. 4 is a cross sectional view of the semiconductor memory device shown in FIG. 3, taken on line A-A. Like or corresponding components are designated by the same reference numerals through the first embodiment and the second embodiment.

As shown in FIGS. 3 and 4, a semiconductor memory device 10 includes a wiring board 11 made of glass-epoxy resin, BT resin (bismaleimide triazine resin) or the like. On a first main surface 11A of the wiring board 11 are formed first inner connecting terminals 111 and second connecting terminals 112, and on a second main surface 11B of the wiring board 11 are formed external connecting terminals 115.

The electric connection between the first inner connecting terminals 111, the second inner connecting terminals 112 and the external connecting terminals 115 is configured in the same manner as in the first embodiment.

On the first main surface 11A of the wiring board 11 are subsequently and alternately stacked a first semiconductor memory chip 21, a second semiconductor memory chip 22, a third semiconductor memory chip 23 and a fourth semiconductor memory chip 24 so that the edge portions of semiconductor chips located below can be exposed. In FIG. 3, the top edge portions or the bottom edge portions of the semiconductor chips 21 to 24 are exposed. Concretely, the bottom edge portions of the first semiconductor chips 21 and the third semiconductor chips 23 are exposed and the top edge portion of the second semiconductor memory chip 22 is exposed.

In this embodiment, the semiconductor memory chips 21 to 24 function as main memories of the semiconductor memory device 10 in this embodiment, and may be made of large capacity semiconductor memory chips such as NAND flash memories or NOR flash memories, respectively.

On the fourth semiconductor memory chip 24 is stacked an interposer chip 25 so that the edge portion of the fourth semiconductor chip 24 can be exposed in the same side of the edge portion of the semiconductor chip located below the fourth semiconductor chip 24. In FIG. 3, the top edge portion of the semiconductor chip 24 are exposed.

On the interposer chip 25 is stacked a semiconductor controller chip 26 and a semiconductor cache memory 31 in the vicinity of the semiconductor controller chip 26.

As shown in FIGS. 3 and 4, electrode pads 211, 221, 231, 241 are formed on the exposed top surfaces of the edge portions of the semiconductor memory chips 21, 22, 23, 24, respectively. The electrode pads 211, 221, 231, 241 constitute first electrode pads.

On the top surface of the interposer chip 25 are formed second electrode pads 251 along the outer edge portion of the interposer chip 25 and third electrode pads 252 in the inner side of the interposer chip 25 so as to be along the outer edge portion of the semiconductor controller chip 26. Then, fourth electrode pads 253 are formed along the outer edge portion of the semiconductor cache memory 31.

On the top surface of the semiconductor controller chip 26 are formed fifth electrode pads 261 along the outer edge portion of the semiconductor controller chip 26. On the top surface of the semiconductor cache memory 31 are formed sixth electrode pads 311.

The first electrode pads 211 to 241 of the semiconductor memory chips 21 to 24 are independently and electrically connected with the first inner connecting terminals 111 on the first main surface 11A of the wiring board 11 via corresponding wires 411, 412, 413, 414. The second electrode pads 251 of the interposer chip 25 are electrically connected with the second inner connecting terminals 112 formed on the first main surface 11A of the wiring board 11 via second wires 42

The electrode pads 261 of the semiconductor controller chip 26 are electrically connected with the third electrode pads 252 of the interposer chip 25 via third wires 43. The sixth electrode pads 311 of the semiconductor cache memory 31 are electrically connected with the fourth electrode pads 253 via fourth wires 44.

In the semiconductor memory device 10 of this embodiment, the semiconductor memory chips 21 to 24 are stacked and arranged, and the semiconductor controller chip 26 and the semiconductor cache memory 31 for the semiconductor chips 21 to 24 are disposed above the semiconductor chips 21 to 24 via the interposer chip 25. Therefore, since the package area can be narrowed in comparison with the case where a plurality of semiconductor chips and a semiconductor controller are arranged in parallel on a wiring board and the case where a plurality of semiconductor chips and a semiconductor controller are independently packaged, the semiconductor memory device can be downsized.

In this case, as shown in FIG. 3, since the electric connection between the semiconductor controller chip 26 and the wiring board 11 and the electric connection between the semiconductor cache memory 31 and the wiring board 11 are conducted via the interposer chip 25 (the electrode pads 261 are electrically connected with the electrode pads 252 via the third wires 431), the length of the wires for electric connection can be shortened in comparison with the case where the semiconductor controller chip 26 are directly and electrically connected with the wiring board 11. Therefore, the electric short in the wires, originated from that the wires are elongated and contacted with one another, can be prevented, and the electric short in the semiconductor chips, originated from that the wires are electrically connected with the semiconductor memory chips, can be prevented. As a result, the malfunction of the semiconductor memory device 10 can be prevented.

In the semiconductor memory device 10 of this embodiment, the semiconductor memory chips 21 to 24 are electrically connected with the first inner connecting terminals 111 of the wiring boards 11 via the wires 411 to 414, respectively.

Moreover, the semiconductor controller chip 26 is electrically connected with the electrode pads 252 of the interposer chip 25 via the wires 43, and the electrode pads 251 of the interposer chip 25 are electrically connected with the second inner connecting terminals 112 formed on the first main surface 11A of the wiring board 11 via the wires 42.

Therefore, predetermined control signals can be independently supplied to the semiconductor memory chips 21 to 24 from the semiconductor controller chip 26 so that the semiconductor memory chips 21 to 24 can be independently controlled. In this point of view, the operating speed of each of the semiconductor memory chips 21 to 24, that is, the semiconductor memory device 10 can be developed.

Since the heats generated at the semiconductor memory chips 21 to 24 can be radiated for the wiring board 11 via the first wires 41 (wires 411, 412, 413, 414), the heat generation at each of the semiconductor memory chips 21 to 24 can be suppressed. Since the heat generated at the semiconductor controller chip 26 is shadowed by the interposer chip 25, the semiconductor memory chips 21 to 24 located below the semiconductor controller chip 26 can not be affected by the heat generation at the semiconductor controller chip 26. As a result, the malfunction of the semiconductor memory device 10 due to the heat generation at the semiconductor memory chips 21 to 24, that is, itself can be prevented.

Third Embodiment

Figure 5:
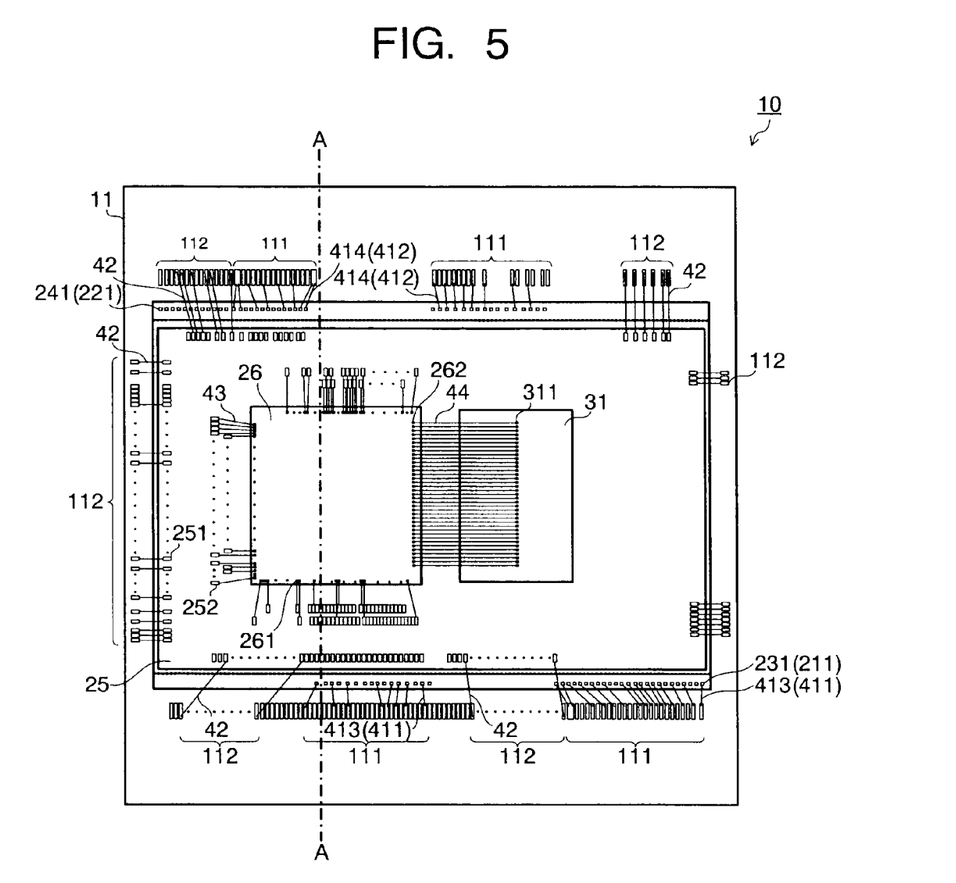
FIG. 5 is a plan view of a semiconductor memory device according to a third embodiment.
Figure 6:
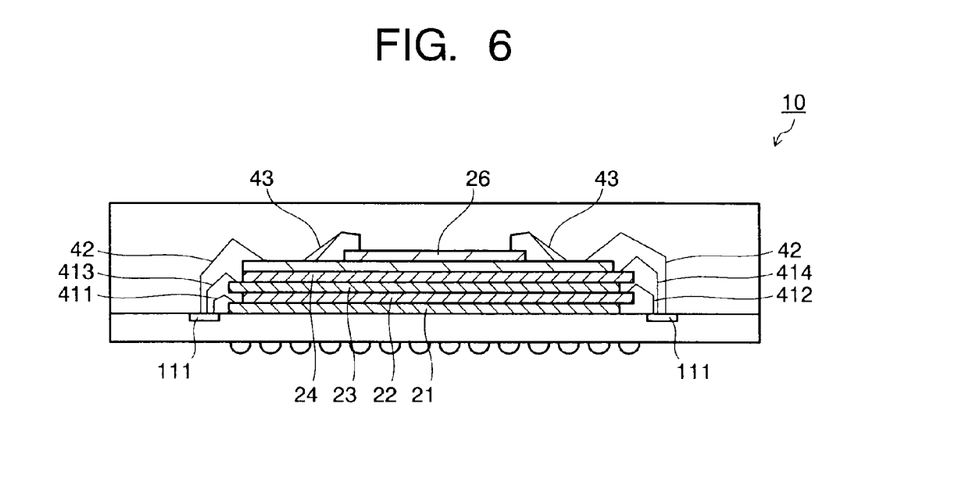
FIG. 6 is a cross sectional view of the semiconductor memory device shown in FIG. 5, taken on line A-A.

FIG. 5 is a plan view of a semiconductor memory device according to a third embodiment, and FIG. 6 is a cross sectional view of the semiconductor memory device shown in FIG. 5, taken on line A-A. Like or corresponding components are designated by the same reference numerals through the first embodiment through the third embodiment.

As shown in FIGS. 5 and 6, the semiconductor memory device 10 in this embodiment is different from the semiconductor memory device 10 as shown in the second embodiment in that electrode pads 311 formed on the semiconductor cache memory 31 are electrically connected with the electrode pads 262 formed along the right edge portion of the semiconductor controller chip 25 via the wires 44, as substitute for that the semiconductor cache memory 31 is electrically connected with the interposer chip 25.

In this embodiment, since the semiconductor cache memory 31 is electrically connected with the semiconductor controller chip 25, the semiconductor cache memory 31 can be controlled by the semiconductor controller chip 25. Therefore, the operationality of the semiconductor memory device 10 can be enhanced.

Since other components and structural configuration in this embodiment can be configured as in the second embodiment, the semiconductor memory device 10 can be exhibit the same effect/function as the semiconductor memory device 10 in the second embodiment.

Fourth Embodiment

Figure 7:
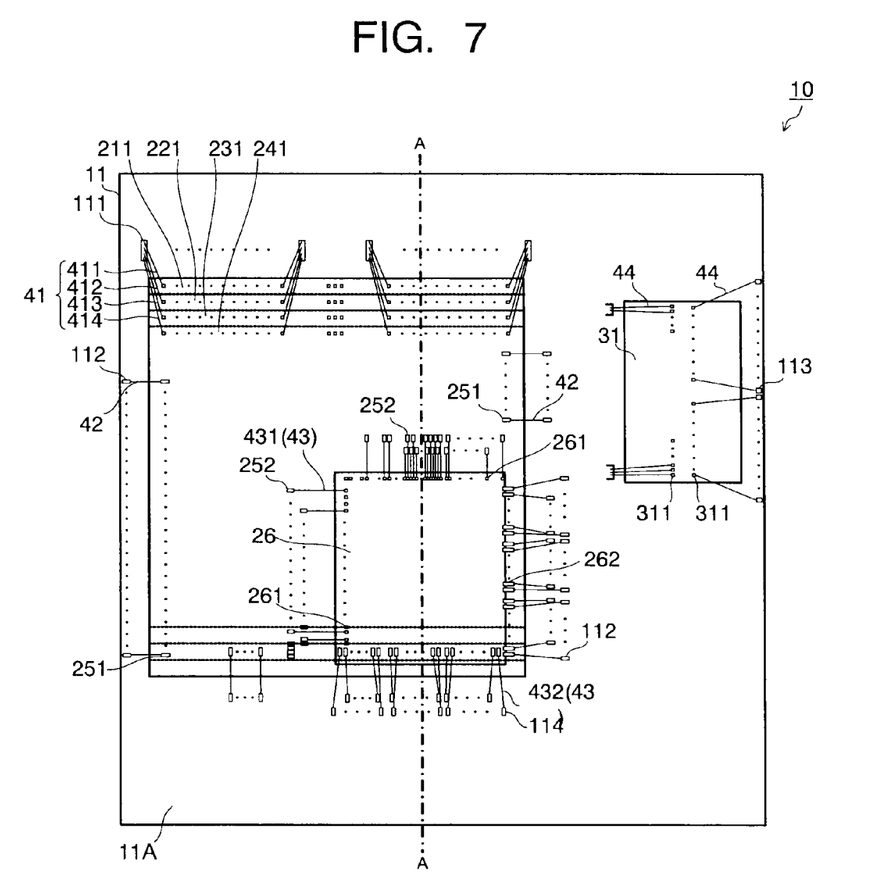
FIG. 7 is a plan view of a semiconductor memory device according to a fourth embodiment.
Figure 8:
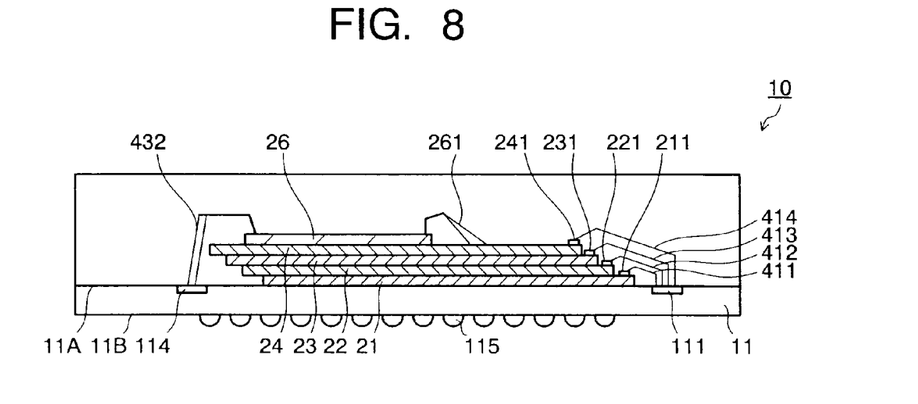
FIG. 8 is a cross sectional view of the semiconductor memory device shown in FIG. 7, taken on line A-A.
Figure 9:
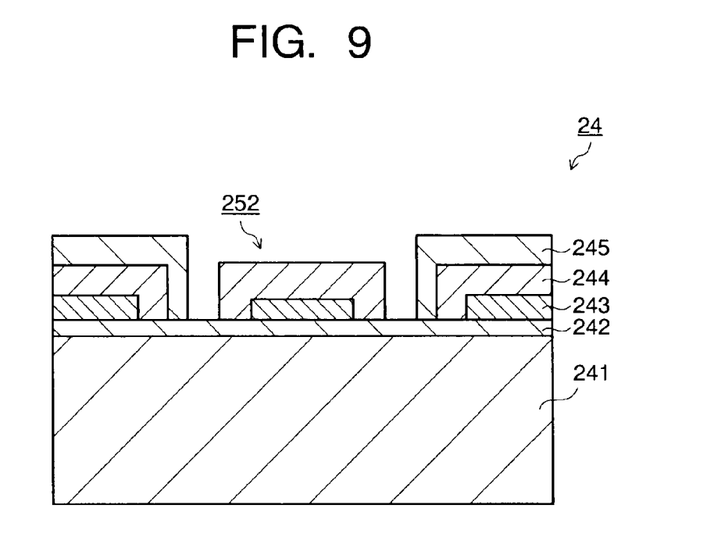
FIG. 9 is a cross sectional view showing the top semiconductor memory chip of the semiconductor memory device shown in FIG. 7.

FIG. 7 is a plan view of a semiconductor memory device according to a fourth embodiment, and FIG. 8 is a cross sectional view of the semiconductor memory device shown in FIG. 7, taken on line A-A. FIG. 9 is a cross sectional view showing the top semiconductor memory chip of the semiconductor memory device shown in FIG. 7.

As shown in FIG. 9, in this embodiment, the fourth semiconductor device 24 located on the top of the semiconductor memory device 10 is configured so as to contain a memory chip 241, a first insulating layer 242 and a resin layer 243 which are subsequently formed on the memory chip 241, a rewiring layer 244 formed via the first insulating layer 242 and the resin layer 243, and a second insulating layer 245 covering the rewiring layer 244. Then, electrode pads 252 and electrode pads 251 (not shown) are formed in the area where the rewiring layer 244 is not formed.

In this embodiment, therefore, the fourth semiconductor memory chip 24 can also function as an interposer chip while the fourth memory chip 24 can function as the inherent memory chip. In this point of view, in this embodiment, the semiconductor controller chip 26 is mounted on the fourth semiconductor memory chip 24 under no interposer chip.

As apparent from the description relating to FIG. 9, in this case, since the fourth semiconductor memory chip 24 functions as an interposer chip, the electrode pads for operating the fourth semiconductor chip 24 as the interposer chip are formed at the fourth semiconductor memory chip 24 in addition to the electrode pads 251 for operating the fourth semiconductor memory chip 24 as the inherent memory chip. Concretely, the second electrode pads 251 are formed along the outer edge portion of the fourth semiconductor chip 24 and the third electrode pads 252 are formed in the inner area of the fourth semiconductor chip 24 so as to be along the outer edge portion of the semiconductor controller chip 26.

Therefore, the second electrode pads 251 of the fourth semiconductor memory chip 24 are electrically connected with the second inner connecting terminals 112 formed on the first main surface 11A of the wiring board 11 via the second wires 42. The electrode pads 261 of the semiconductor controller chip 26 are electrically connected with the third electrode pads 252 of the fourth semiconductor memory chip 24 via the wires 431. Other components and structural configuration in this embodiment can be configured as in the first embodiment.

In the semiconductor memory device 10 of this embodiment, the semiconductor memory chips 21 to 24 are stacked and arranged and the semiconductor controller chip 26 for the semiconductor chips 21 to 24 is disposed on the fourth semiconductor chip 24 located at the top of the semiconductor memory device 10 and functioning as the interposer chip. Therefore, since the package area can be narrowed in comparison with the case where a plurality of semiconductor chips and a semiconductor controller are arranged in parallel on a wiring board and the case where a plurality of semiconductor chips and a semiconductor controller are independently packaged, the semiconductor memory device can be downsized.

Moreover, since the function of the interposer is imparted to the top semiconductor memory chip (fourth memory chip 24 in this embodiment), it is not required to form an additional interposer chip. Therefore, the total thickness of the semiconductor memory device 10 can be decreased.

Furthermore, the lengths of the wires for electric connection can be shortened in comparison with the case where the semiconductor controller chip 26 is directly and electrically connected with the wiring board 11 as in the first embodiment. Therefore, the electric short in the wires, originated from that the wires are elongated and contacted with one another, can be prevented, and the electric short in the semiconductor chips, originated from that the wires are electrically connected with the semiconductor memory chips, can be prevented. As a result, the malfunction of the semiconductor memory device 10 can be prevented.

Since the semiconductor memory chips 21 to 24 are independently controlled as in the first embodiment, the operating speed of each of the semiconductor memory chips 21 to 24, that is, the semiconductor memory device 10 can be developed. Moreover, the heat radiation for the semiconductor memory chips 21 to 24 can be enhanced so that the heat generation at each of the semiconductor memory chips 21 to 24 can be suppressed. As a result, the malfunction of the semiconductor memory device 10 due to the heat generation at the semiconductor memory chips 21 to 24, that is, itself can be prevented.

In this embodiment, the function of the interposer is imparted to the semiconductor memory chip located at the top of the semiconductor memory device by configuring the top semiconductor memory chip as depicted in FIG. 9. However, the semiconductor memory chips located below the top semiconductor memory chip may be also configured as depicted in FIG. 9 so as to simplify the manufacturing steps of the semiconductor memory device. Namely, if the top semiconductor memory chip is formed as depicted in FIG. 9 different from the lower semiconductor memory chips, the total manufacturing steps of the semiconductor memory device is complicated, but if all of the semiconductor memory chips are formed as depicted in FIG. 9, the total manufacturing steps of the semiconductor memory device can be simplified.

In the above case, only the top semiconductor memory chip functions as the interposer chip.

Fifth Embodiment

Figure 10:
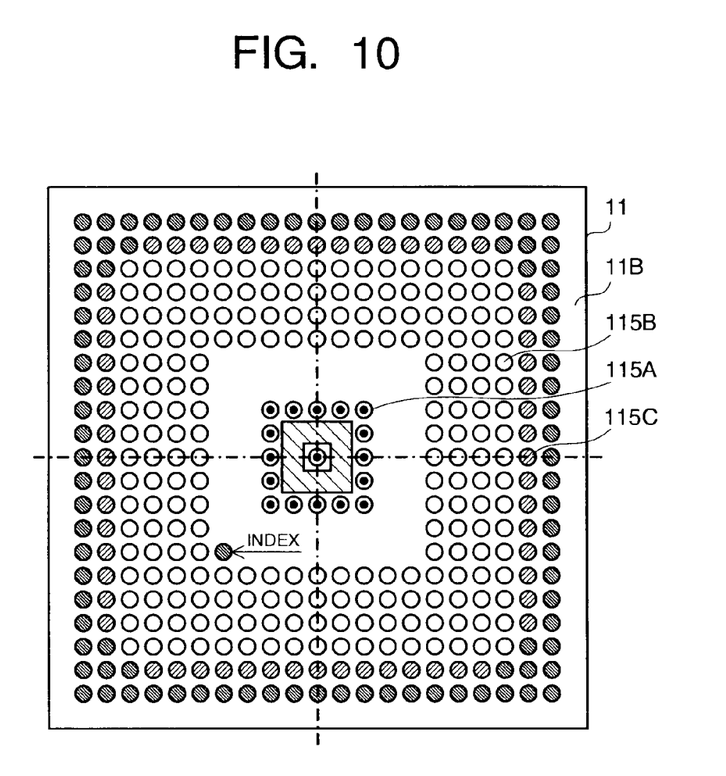
FIG. 10 is a plan view of a semiconductor memory device according to a fifth embodiment, as viewed from a second main surface of a wiring board.

FIG. 10 is an explanatory view for a semiconductor memory device according to a fifth embodiment. FIG. 10 is a plan view of the semiconductor memory device 10 as viewed from the second main surface of the wiring board 11.

As shown in FIG. 10, the external connecting terminals 115 are formed on the second main surface 11B of the wiring board 11. The terminals 115A of the terminals 115 located at the center of the wiring board 11 function as supplying power supply voltage to the semiconductor memory chips and the like stacked on the first main surface 11A of the wiring board 11, and the terminals 115B of the terminals 115 formed around the terminals 115A function as functional terminals for transferring data stored in the semiconductor memory chips to the outside, that is, an external circuit.

In this embodiment, the dummy terminals 115C not exhibiting electric function are provided around the terminals 115B. For example, therefore, the heats generated at the semiconductor memory chips 21 to 24 and radiated for wiring board 11 via the first wires 41 (wires 411, 412, 413, 414) can be radiated outside via the terminals 115C in addition to the terminals 115A and 115B.

Therefore, the heat generation in the semiconductor memory device 10 can be suppressed more effectively so that the malfunction of the semiconductor memory device 10 due to the heat generation can be prevented.

Although the present invention was described in detail with reference to the above examples, this invention is not limited to the above disclosure and every kind of variation and modification may be made without departing from the scope of the present invention.

For example, in the embodiments described above, the number of semiconductor memory chip is set to four, but may be to any number as occasion demands.

The technical features in the fourth and fifth embodiments can be applied to the semiconductor memory devices based on the second and third embodiments in addition to the semiconductor memory device based on the first embodiment.

In the embodiments, moreover, the external connecting terminals of BGA type are employed, but external connecting terminals of LGA type or PGA type may be employed.

What is claimed is:

1. A semiconductor memory device, comprising:

a wiring board having a first main surface on which first inner connecting terminals and second inner connecting terminals are formed and having a second main surface on which external connecting terminals are formed;

a plurality of semiconductor memory chips which are stacked on the first main surface of the wiring board, each semiconductor memory chip having first electrode pads arranged along at least one outer edge portion thereof on a top surface thereof so that the first electrode pads are electrically connected with the first inner connecting terminals via first wires, respectively;

an interposer chip which is formed on the plurality of semiconductor memory chips and which has second electrode pads arranged along at least one outer edge portion thereof on a top surface thereof and third electrode pads, fourth electrode pads arranged in an inner side thereof on the top surface thereof so that the second electrode pads are electrically connected with the second inner connecting terminals via second wires, respectively;

a semiconductor controller chip which is formed on the interposer chip and which has fifth electrode pads arranged along at least one outer edge portion thereof on a top surface thereof so that the fifth electrode pads are electrically connected with the third electrode pads via third wires, respectively; and a semiconductor cache memory chip which is formed on the interposer chip.

2. The semiconductor memory device as set forth in claim 1, wherein the semiconductor cache memory chip has sixth electrode pads on a top surface thereof so that the sixth electrode pads are electrically connected with the fourth electrode pads via fourth wires, respectively.

3. The semiconductor memory device as set forth in claim 1, wherein the semiconductor cache memory chip has sixth electrode pads on a top surface thereof so that the sixth electrode pads are electrically connected with the fifth electrode pads via fourth wires, respectively.

4. The semiconductor memory device as set forth in claim 1, wherein the plurality of semiconductor memory chips are configured as NAND flash memory chips or NOR flash memory chips.

5. The semiconductor memory device as set forth in claim 1, wherein the semiconductor cache memory chip is configured as a DRAM chip or a SDRAM chip.

6. The semiconductor memory device as set forth in claim 1, wherein the external connecting terminals includes dummy terminals for heat radiation.

* * * * *